US012675615B2

(12) United States Patent
Myrand-Lapierre et al.

(10) Patent No.: US 12,675,615 B2
(45) Date of Patent: Jul. 7, 2026

(54) EFFICIENT CREATION OF COMPUTER-GENERATED FORCE (CGF) ENTITIES USING FREQUENCY RESPONSE MATRICES

(71) Applicant: CAE Inc., Saint-Laurent (CA)

(72) Inventors: Vincent Myrand-Lapierre, Saint-Laurent (CA); Gregory Moszczynski, North York (CA)

(73) Assignee: CAE Inc., Saint-Laurent (CA)

( * ) Notice: Subject to any disclaimer, the term of this patent is extended or adjusted under 35 U.S.C. 154(b) by 1076 days.

(21) Appl. No.: 17/706,111

(22) Filed: Mar. 28, 2022

(65) Prior Publication Data

US 2022/0335175 A1 Oct. 20, 2022

(30) Foreign Application Priority Data

Mar. 30, 2021 (CA) ................................. CA 3113480

(51) Int. Cl.
 *G06F 17/12* (2006.01)
 *G06F 30/15* (2020.01)
 (Continued)

(52) U.S. Cl.
 CPC .............. *G06F 30/15* (2020.01); *G06F 17/12* (2013.01); *G06F 30/17* (2020.01); *G06F 30/20* (2020.01); *G09B 9/10* (2013.01)

(58) Field of Classification Search
 CPC .......... G06F 30/15; G06F 30/17; G06F 17/12; G06F 30/20; G09B 9/06; G09B 9/12; G09B 9/04
 See application file for complete search history.

(56) References Cited

U.S. PATENT DOCUMENTS

2017/0046968 A1* 2/2017 Gato ....................... G06F 30/15

OTHER PUBLICATIONS

Leung, J., Moszczynski, G., and Grant, P., "A State Estimation Approach for a High Angle-of-Attack Parameter Estimation from Certification Flight Data", Jan. 2019, AIAA SciTech Forum, doi. org/10.2514/6.2019-0013 (Year: 2019).*

(Continued)

*Primary Examiner* — Emerson C Puente
*Assistant Examiner* — Emily Gorman Leathers
(74) *Attorney, Agent, or Firm* — Gowling WLG (Canada) LLP

(57) ABSTRACT

Disclosed is a method of efficiently generating a computer-generated forces (CGF) entity that includes a simulated external vehicle within an interactive computer simulation that is displayed within an interactive simulation environment by an interactive computer simulation station. The method entails creating an array of state-space model structures having initially unknown parameters that, once known, will define a linearized approximation of a non-linear model of the simulated external vehicle, generating frequency response matrices by exciting each input-output relationship of the non-linear model of the simulated external vehicle at a plurality of trim conditions using very short Gaussian pulses, wherein the frequency response matrices define a plurality of linear equations, calculating the parameters by solving the linear equations of the frequency response matrices to thereby provide an array of state-space models that defines the linearized approximation of the non-linear model, and using the array of state-space models to generate the CGF entity.

18 Claims, 4 Drawing Sheets

(51) Int. Cl.
G06F 30/17 (2020.01)
G06F 30/20 (2020.01)
G09B 9/10 (2006.01)

(56) References Cited

OTHER PUBLICATIONS

Lucia, D., Beran, P., and Silva, W., "Reduced-order modeling: new approaches for computational physics", 2004, Progress in Aerospace Sciences, vol. 40, pp. 51-117 (Year: 2004).*

Moin, L., Uddin, V., and Baig, A., "State Space Model of an Aircraft Using Simulink", Dec. 2017, International Journal of System Modeling and Simulation, vol. 2(4), DOI: 10.24178/ijsms.2017.2.4.01 (Year: 2017).*

Seywald, K., "Impact of Aeroelasticity on Flight Dynamics and Handling Qualities of Novel Aircraft Configurations", 2016, PhD Dissertation, Technische Universitat Munchen (Year: 2016).*

Silva, W., Raveh, D., Development of Unsteady Aerodynamic State-Space Models from CFD-Based Pulse Responses, Aug. 2001, 19th AIAA Applied Aerodynamics Conference (Year: 2001).*

Wang, S., Liu, Y., "Modeling and Simulation of a CGF Aerial Targets for Simulation Training", 2020, International Conference on Computer Intelligent Systems and Network Remote Control (Year: 2020).*

Kautsky, J., Nichols, N., Van Dooren, P., "Robust pole assignment in linear state feedback", 1985, Int. J. Control, vol. 41, No. 5, pp. 1129-1155 (Year: 1985).*

Extended European Search Report dated Feb. 3, 2023.

Canadian Office Action dated Jun. 21, 2021.

D1 from Canadian Office Action (Seywald, K. "Impact of Aeroelasticity on Flight Dynamics and Handling Qualities of Novel Aircraft Configurations", Doctoral Dissertation, Technische Universitat Munchen, pp. 202 in total, https://mediatum.ub.tum.de/doc/1296378/file.pdf, 2016.

Examination Report dated Nov. 27, 2025 from corresponding European patent application 22165580.6.

Teng, Teck-Hou et al., "Adaptive computer-generated forces for simulator-based training", Expert Systems With Applications, Elsevier, Jul. 18, 2013, DOI: 10.1016/J.ESWA.2013.07.004.

Lu, Linghai et al., "Rotorcraft Simulation Renovation Through System Identification", Jul. 1, 2016, http://hdl.handle.net/20.500.11881/923.

* cited by examiner

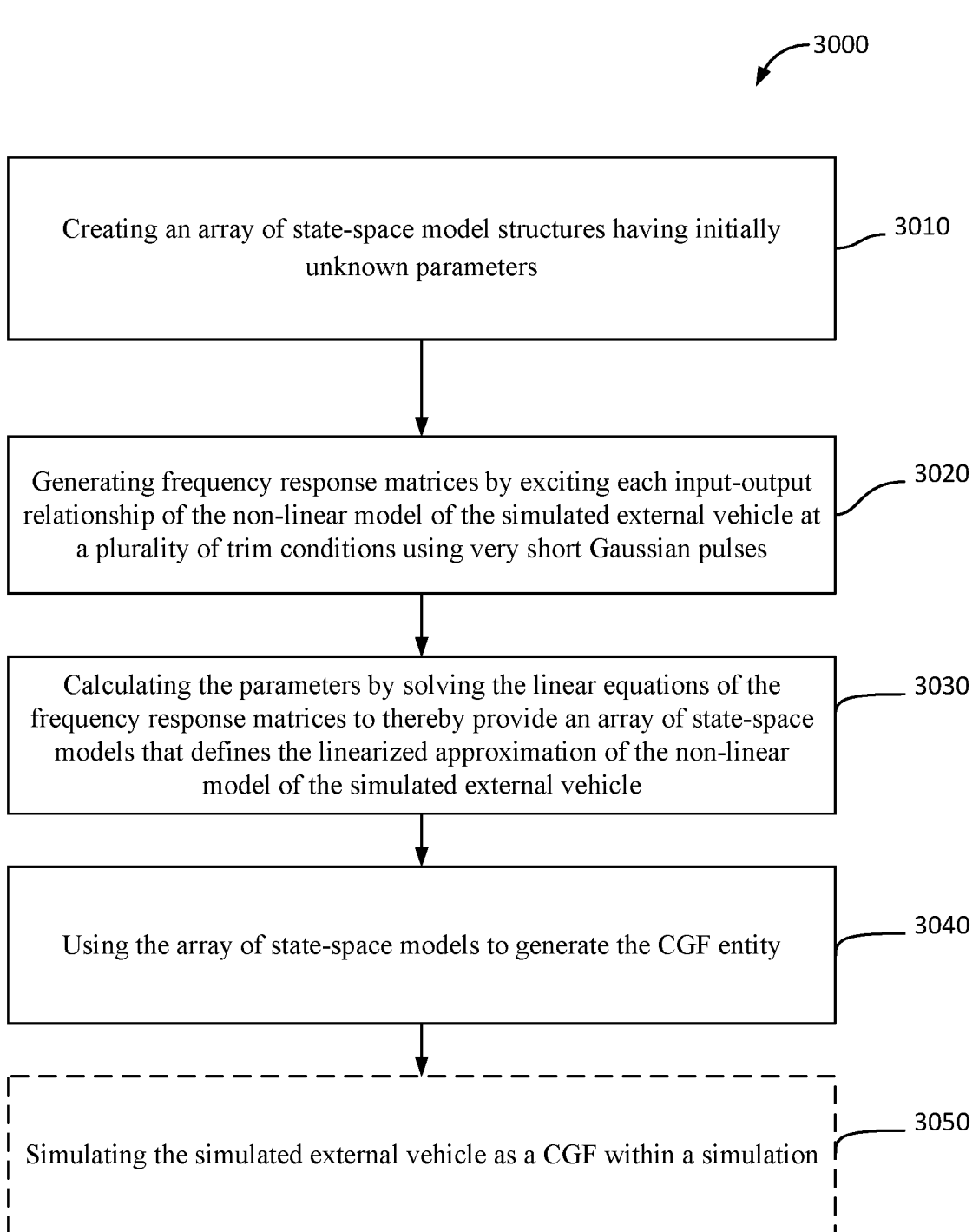

3000

Creating an array of state-space model structures having initially unknown parameters — 3010

Generating frequency response matrices by exciting each input-output relationship of the non-linear model of the simulated external vehicle at a plurality of trim conditions using very short Gaussian pulses — 3020

Calculating the parameters by solving the linear equations of the frequency response matrices to thereby provide an array of state-space models that defines the linearized approximation of the non-linear model of the simulated external vehicle — 3030

Using the array of state-space models to generate the CGF entity — 3040

Simulating the simulated external vehicle as a CGF within a simulation — 3050

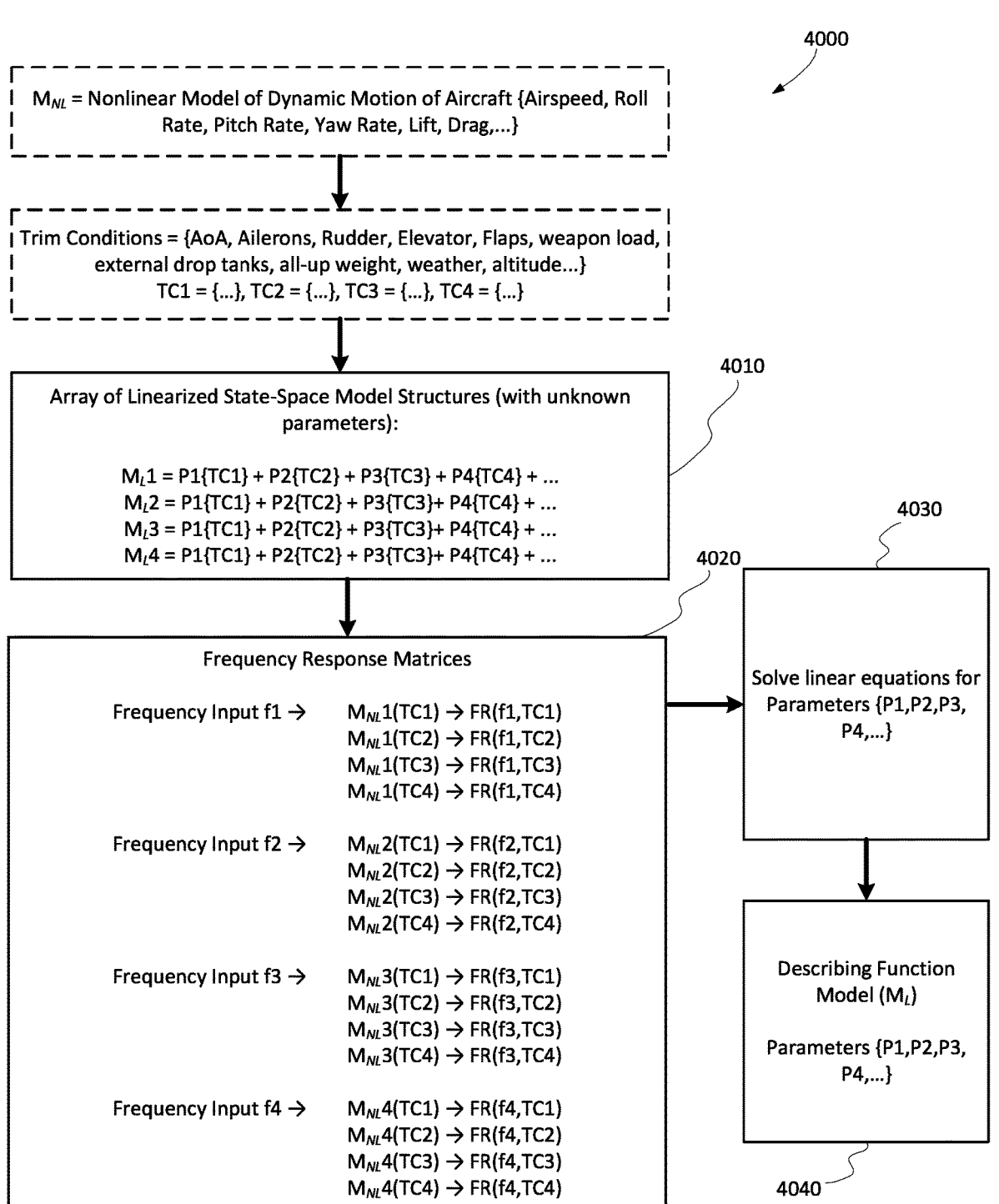

$M_{NL}$ = Nonlinear Model of Dynamic Motion of Aircraft {Airspeed, Roll Rate, Pitch Rate, Yaw Rate, Lift, Drag,...}

Trim Conditions = {AoA, Ailerons, Rudder, Elevator, Flaps, weapon load, external drop tanks, all-up weight, weather, altitude...}
TC1 = {...}, TC2 = {...}, TC3 = {...}, TC4 = {...}

4010

Array of Linearized State-Space Model Structures (with unknown parameters):

$M_L1$ = P1{TC1} + P2{TC2} + P3{TC3} + P4{TC4} + ...
$M_L2$ = P1{TC1} + P2{TC2} + P3{TC3}+ P4{TC4} + ...
$M_L3$ = P1{TC1} + P2{TC2} + P3{TC3}+ P4{TC4} + ...
$M_L4$ = P1{TC1} + P2{TC2} + P3{TC3}+ P4{TC4} + ...

4020

4030

Frequency Response Matrices

Frequency Input f1 →     $M_{NL}1$(TC1) → FR(f1,TC1)
                         $M_{NL}1$(TC2) → FR(f1,TC2)
                         $M_{NL}1$(TC3) → FR(f1,TC3)
                         $M_{NL}1$(TC4) → FR(f1,TC4)

Frequency Input f2 →     $M_{NL}2$(TC1) → FR(f2,TC1)
                         $M_{NL}2$(TC2) → FR(f2,TC2)
                         $M_{NL}2$(TC3) → FR(f2,TC3)
                         $M_{NL}2$(TC4) → FR(f2,TC4)

Frequency Input f3 →     $M_{NL}3$(TC1) → FR(f3,TC1)
                         $M_{NL}3$(TC2) → FR(f3,TC2)
                         $M_{NL}3$(TC3) → FR(f3,TC3)
                         $M_{NL}3$(TC4) → FR(f3,TC4)

Frequency Input f4 →     $M_{NL}4$(TC1) → FR(f4,TC1)
                         $M_{NL}4$(TC2) → FR(f4,TC2)
                         $M_{NL}4$(TC3) → FR(f4,TC3)
                         $M_{NL}4$(TC4) → FR(f4,TC4)

Solve linear equations for Parameters {P1,P2,P3, P4,...}

Describing Function Model ($M_L$)

Parameters {P1,P2,P3, P4,...}

EFFICIENT CREATION OF COMPUTER-GENERATED FORCE (CGF) ENTITIES USING FREQUENCY RESPONSE MATRICES

TECHNICAL FIELD

The present invention relates to interactive computer simulations and, more particularly, to modeling of simulated objects in interactive computer simulations.

BACKGROUND

In an interactive computer simulation such as a flight simulator or a battlefield simulator, the interactive simulation environment may contain one or more computer-generated forces (CGF) entities. A CGF entity may be an allied, neutral or enemy aircraft, tank, warship, missile, or other simulated external vehicle. The interactive computer simulation creates the CGF entity using a model of the dynamics or kinematics of the simulated external vehicle as well as rules, algorithms or artificial intelligence that characterizes the behavior of the CGF entity. Modeling the vehicle may be performed using a physics-based model or a parametric-type linearized stability derivative-based model.

Accurately modeling the vehicle in order to generate a CGF entity for a simulation is an extremely laborious process by which the response of a vehicle model is compared with actual flight test data and the parameters are tuned.

It is thus a significant challenge to generate high-fidelity CGF entities for a simulation. The present invention provides a solution to this problem.

SUMMARY

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In general, the present invention provides a method, system and computer-readable medium to efficiently (i.e., more rapidly) create a computer-generated forces (CGF) entity that includes a model of a simulated external vehicle. The efficient creation of the CGF entity is accomplished, as described in greater detail below, by exciting each input-output relationship of a non-linear model at various trim conditions to obtain frequency responses which are used to calculate parameters of state-space models that form a describing function that linearly approximates the non-linear model of the simulated vehicle.

A first aspect of the present disclosure is a method of efficiently generating a computer-generated forces (CGF) entity that includes a simulated external vehicle to be used within an interactive computer simulation that is displayed within an interactive simulation environment by an interactive computer simulation station. The method entails creating an array of state-space model structures having initially unknown parameters that, once known, will define a linearized approximation of a non-linear model of the simulated external vehicle. The method further entails generating frequency response matrices by exciting each input-output relationship of the non-linear model of the simulated external vehicle at a plurality of trim conditions using very short Gaussian pulses, wherein the frequency response matrices define a plurality of linear equations. The method further includes calculating the parameters by solving the linear equations of the frequency response matrices to thereby provide an array of state-space models that defines the linearized approximation of the non-linear model of the simulated external vehicle and using the array of state-space models to generate the CGF entity.

A second aspect of the present disclosure is a computer system to efficiently generate a computer-generated forces (CGF) entity that includes a simulated external vehicle within an interactive computer simulation that is displayed within an interactive simulation environment by an interactive computer simulation station, the simulated external vehicle being distinct from a simulated user-controlled vehicle controlled by a user of the interactive computer simulation. The computer system has a processor and a memory coupled to the processor. The processor is configured to create an array of state-space model structures having initially unknown parameters that, once known, will define a linearized approximation of a non-linear model of the simulated external vehicle and to generate frequency response matrices by exciting each input-output relationship of the non-linear model of the simulated external vehicle at a plurality of trim conditions using very short Gaussian pulses, wherein the frequency response matrices define a plurality of linear equations. The processor is further configured to calculate the parameters by solving the linear equations of the frequency response matrices to thereby provide an array of state-space models that defines the linearized approximation of the non-linear model of the simulated external vehicle and use the array of state-space models to generate the CGF entity.

A third aspect of the present disclosure is a non-transitory computer-readable medium having computer-readable code which is executable by a processor to create an array of state-space model structures having initially unknown parameters that, once known, will define a linearized approximation of a non-linear model of the simulated external vehicle and to generate frequency response matrices by exciting each input-output relationship of the non-linear model of the simulated external vehicle at a plurality of trim conditions using very short Gaussian pulses, wherein the frequency response matrices define a plurality of linear equations. The processor is further configured to calculate the parameters by solving the linear equations of the frequency response matrices to thereby provide an array of state-space models that defines the linearized approximation of the non-linear model of the simulated external vehicle and use the array of state-space models to generate the CGF entity.

BRIEF DESCRIPTION OF THE DRAWINGS

Further features and exemplary advantages of the present invention will become apparent from the following detailed description, taken in conjunction with the appended drawings, in which:

FIG. 3 is a flowchart of a method of generating a CGF entity in accordance with an embodiment of the present invention; and FIG. 4 is a flowchart of a method of generating an aircraft-type CGF entity.

DETAILED DESCRIPTION

Figure 1:
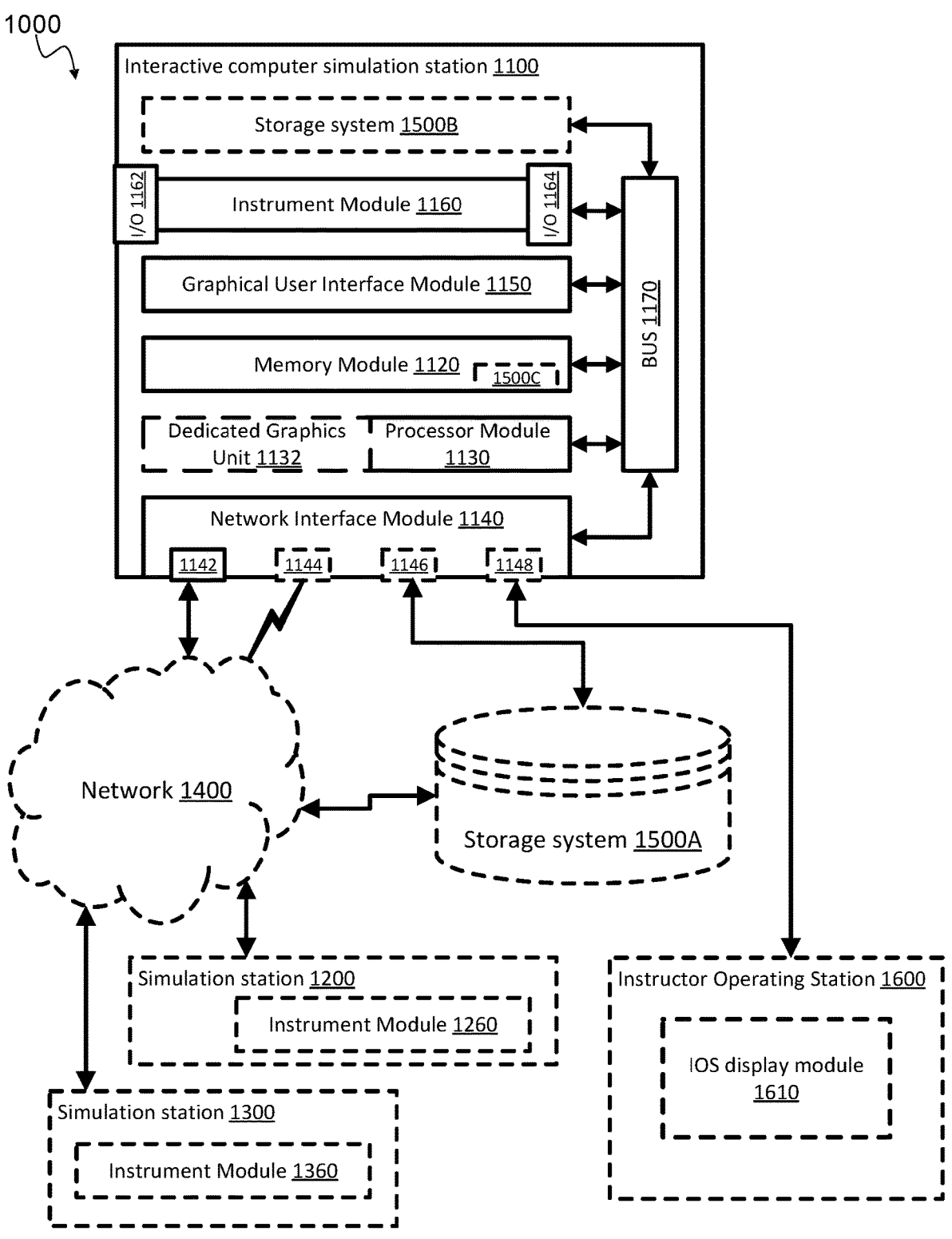
FIG. 1 is a logical modular representation of an exemplary computer system in accordance with one embodiment of the present invention.

In an interactive computer simulation, such as a flight simulator or battlefield simulator, a computer-generated environment is provided with different structures (e.g., buildings, streets, airports, lakes, rivers, etc.) and external vehicles such as for example other aircraft. For instance, the computer-generated environment may specify a constant gravitational force value and a variable air pressure value that varies as a function of altitude in the computer-generated environment. Many other rules are also set in the interactive computer simulation (e.g., weather parameters, parameterized lighting conditions, etc.), which may be set to replicate a realistic environment, an expected environment or a fictitious one, depending on the context of the interactive computer simulation. The computer-generated environment may also comprise other dynamic representations (e.g., simulated moving vehicles, simulated humans, etc.). The interactive computer simulation also comprises one or more simulated interactive objects controlled by at least one user of the interactive computer simulation. For instance, the simulated interactive object may be a vehicle, e.g., airplane, helicopter, spacecraft, tank, etc. A physical instrument module is provided for the user to control the simulated interactive object in the interactive computer simulation using one or more tangible instruments.

The interactive computer simulation may, for instance, be used for training purposes and/or for enacting a scenario from historical data (e.g., from a recording of a surgical procedure, from an event recording device (e.g., black box) from an aircraft, a train, etc.). The interactive computer simulation may be scenario-based (e.g., where simulation code driving the interactive computer generated environment comprises one or more predetermined events, motions, sounds, etc.).

The interactive computer simulation may be a training simulation program such as a flight simulation software or a battlefield simulation software. The interactive computer simulation may also be related to a vehicle interactive computer simulation involving one or more simulated vehicle(s). The present invention is not limited by the type of interactive simulated vehicle, which may be terrestrial (car, tank, etc.), underground, airborne (e.g., an aircraft, a space shuttle), waterborne (e.g., a boat), etc. The interactive computer simulation may also be related to a game, which could differ from the training simulation because of the different rules that apply in the computer generated environment (e.g., varying gravity force, presence of unrealistic elements (force fields), varying response to damage, varied capacity to undo or affect past actions, success measured on different results, etc.).

The interactive computer simulation is provided by an interactive computer simulation system, or simply a "simulator", such as a flight simulator or battlefield simulator. A user of the simulator is seated or otherwise positioned within the simulator and interacts with the environment by controlling the simulated object such as a user vehicle, e.g. an aircraft that the user is virtually flying. In the example of a flight simulator, the simulator may include a mock-up of a cockpit with a pilot seat, one or more display screens to display a simulated environment outside of the windows of the cockpit, speakers to play sounds, a mechanism to move the cockpit, and tangible flight controls (and other tangible cockpit instrumentation) to control the aircraft in an immersive virtual-reality environment.

Reference is now made to the drawings in which FIG. 1 shows a logical modular representation of an exemplary interactive computer simulation system 1000 providing a model associated with a simulated interactive object of an interactive computer simulation, in accordance with the teachings of the present invention. The interactive computer simulation system 1000 comprises a simulation-computing device. In some embodiments, the simulation-computing device is an interactive computer simulation station, which may be executing one or more interactive computer simulations such as a flight simulation software instance or a battlefield simulation software instance.

In the depicted example of FIG. 1, the simulation-computing device comprises a memory module 1120, a processor module 1130 and a network interface module 1140. The processor module 1130 may represent a single processor with one or more processor cores or an array of processors, each comprising one or more processor cores. In some embodiments, the processor module 1130 may also comprise a dedicated graphics processing unit 1132. The dedicated graphics processing unit 1132 may be required, for instance, when the interactive computer simulation system 1000 performs an immersive simulation (e.g., pilot training-certified flight simulator), which requires extensive image generation capabilities (i.e., quality and throughput) to maintain expected realism of such immersive simulation (e.g., between 5 and 60 images rendered per seconds or maximum between 15 ms and 200 ms for each rendered image). In some embodiments, each of the simulation stations 1200, 1300 comprise a processor module having a dedicated graphics processing unit similar to the dedicated graphics processing unit 1132. The memory module 1120 may comprise various types of memory (different standardized or kinds of Random Access Memory (RAM) modules, memory cards, Read-Only Memory (ROM) modules, programmable ROM, etc.). The network interface module 1140 represents at least one physical interface that can be used to communicate with other network nodes. The network interface module 1140 may be made visible to the other modules of the computer system 1100 through one or more logical interfaces. The actual stacks of protocols used by the physical network interface(s) and/or logical network interface(s) 1142, 1144, 1146, 1148 of the network interface module 1140 do not affect the teachings of the present invention. The variants of processor module 1130, memory module 1120 and network interface module 1140 usable in the context of the present invention will be readily apparent to persons skilled in the art.

A bus 1170 is depicted as an example of means for exchanging data between the different modules of the computer system 1100. The present invention is not affected by the way the different modules exchange information between them. For instance, the memory module 1120 and the processor module 1130 could be connected by a parallel bus, but could also be connected by a serial connection or involve an intermediate module (not shown) without affecting the teachings of the present invention.

Likewise, even though explicit references to the memory module 1120 and/or the processor module 1130 are not made throughout the description of the various embodiments, persons skilled in the art will readily recognize that such modules are used in conjunction with other modules of the computer system 1100 to perform routine as well as innovative steps related to the present invention.

The simulation computing device also comprises a Graphical User Interface (GUI) module 1150 comprising one or more display screen(s). The display screens of the GUI module 1150 could be split into one or more flat panels, but could also be a single flat or curved screen visible from an expected user position (not shown) in the simulation computing device. For instance, the GUI module 1150 may comprise one or more mounted projectors for projecting images on a curved refracting screen. The curved refracting screen may be located far enough from the user of the interactive computer program to provide a collimated display. Alternatively, the curved refracting screen may provide a non-collimated display.

The interactive computer simulation system 1000 comprises a storage system 1500A-C that may log dynamic data in relation to the dynamic sub-systems while the interactive computer simulation is performed. FIG. 1 shows examples of the storage system 1500A-C as a distinct database system 1500A, a distinct module 1500B of the computer system 1110 or a sub-module 1500C of the memory module 1120 of the computer system 1110. The storage system 1500A-C may also comprise storage modules (not shown) on the simulation stations 1200, 1300. The storage system 1500A-C may be distributed over different systems A, B, C and/or the simulations stations 1200, 1300 or may be in a single system. The storage system 1500A-C may comprise one or more logical or physical as well as local or remote hard disk drive (HDD) (or an array thereof). The storage system 1500A-C may further comprise a local or remote database made accessible to the computer system 1100 by a standardized or proprietary interface or via the network interface module 1140. The variants of storage system 1500A-C usable in the context of the present invention will be readily apparent to persons skilled in the art.

An Instructor Operating Station (IOS) 1600 may be provided for allowing various management tasks to be performed in the interactive computer simulation system 1000. The tasks associated with the IOS 1600 allow for control and/or monitoring of one or more ongoing interactive computer simulations. For instance, the IOS 1600 may be used for allowing an instructor to participate to the interactive computer simulation and possibly additional interactive computer simulation(s). In some embodiments, the IOS may be provided by the simulation-computing device. In other embodiments, the IOS may be co-located with the simulation computing device (e.g., within the same room or simulation enclosure) or remote therefrom (e.g., in different rooms or in different locations). Skilled persons will understand the many instances of the IOS may be concurrently provided in the interactive computer simulation system 1000. The IOS 1600 may provide a computer simulation management interface, which may be displayed on a dedicated IOS display module 1610 or the GUI module 1150. The IOS 1600 could be located in close proximity with the simulation-computing device, but may also be provided outside of the computer system 1100, in communication therewith.

The IOS display module 1610 may comprise one or more display screens such as a wired or wireless flat screen, a wired or wireless touch-sensitive display, a tablet computer, a portable computer or a smart phone. When multiple computing devices 1100 and/or stations 1200, 1300 are present in the computer system 1000, the IOS 1600 may present different views of the computer program management interface (e.g., to manage different aspects therewith) or they may all present the same view thereof. The computer program management interface may be permanently shown on a first of the screens of the IOS display module 1610 while a second of the screen of the IOS display module 1610 shows a view of the interactive computer simulation (i.e., adapted view considering the second screen from images displayed through the display module 1150). The computer program management interface may also be triggered on the IOS 1600, e.g., by a touch gesture and/or an event in the interactive computer program (e.g., milestone reached, unexpected action from the user, or action outside of expected parameters, success or failure of a certain mission, etc.). The computer program management interface may provide access to settings of the interactive computer simulation and/or of the simulation-computing device. A virtualized IOS (not shown) may also be provided to the user on the display module 1150 (e.g., on a main screen, on a secondary screen or a dedicated screen thereof). In some embodiments, a Brief and Debrief System (BDS) may also be provided. The BDS may be seen as a version of the IOS used during playback of recorded data only.

The tangible instrument provided by the instrument modules 1160, 1260 and/or 1360 are closely related to the element being simulated. In the example of the simulated aircraft system, for instance, in relation to an exemplary flight simulator embodiment, the instrument module 1160 may comprise a control yoke and/or side stick, rudder pedals, a throttle, a flap switch, a transponder, a landing gear lever, a parking brake switch, aircraft instruments (air speed indicator, attitude indicator, altimeter, turn coordinator, vertical speed indicator, heading indicator, etc.). Depending on the type of simulation (e.g., level of immersivity), the tangible instruments may be more or less realistic compared to those that would be available in an actual aircraft. For instance, the tangible instrument provided by the modules 1160, 1260 and/or 1360 may replicate an actual aircraft cockpit where actual instruments found in the actual aircraft or physical interfaces having similar physical characteristics are provided to the user (or trainee). As previously described, the actions that the user or trainee takes with one or more of the tangible instruments provided via the instrument module(s) 1160, 1260 and/or 1360 (modifying lever positions, activating/deactivating switches, etc.) allow the user or trainee to control the virtual simulated element in the interactive computer simulation. In the context of an immersive simulation being performed in the interactive computer simulation system 1000, the instrument module 1160, 1260 and/or 1360 would typically support a replicate of an actual instrument panel found in the actual system being the subject of the immersive simulation. In such an immersive simulation, the dedicated graphics processing unit 1132 would also typically be required. While the present invention is applicable to immersive simulations (e.g., flight simulators certified for commercial pilot training and/or military pilot training), skilled persons will readily recognize and be able to apply its teachings to other types of interactive computer simulations.

In some embodiments, an optional external input/output (I/O) module 1162 and/or an optional internal input/output (I/O) module 1164 may be provided with the instrument module 1160. Skilled people will understand that any of the instrument modules 1160, 1260 and/or 1360 may be provided with one or both of the I/O modules such as the ones depicted for the computer system 1000. The external input/output (I/O) module 1162 of the instrument module 1160, 1260 and/or 1360 may connect one or more external tangible instruments (not shown) therethrough. The external I/O module 1162 may be required, for instance, for interfacing the interactive computer simulation system 1000 with one or more tangible instrument identical to an Original Equipment Manufacturer (OEM) part that cannot be integrated into the computer system 1100 and/or the simulation station(s) 1200, 1300 (e.g., a tangible instrument exactly as the one that would be found in the actual system subject of the interactive simulation). The internal input/output (I/O) module 1162 of the instrument module 1160, 1260 and/or 1360 may connect one or more tangible instruments integrated with the instrument module 1160, 1260 and/or 1360. The I/O 1162 may comprise necessary interface(s) to exchange data, set data or get data from such integrated tangible instruments. The internal I/O module 1162 may be required, for instance, for interfacing the interactive computer simulation system 1100 with one or more integrated tangible instrument identical to an Original Equipment Manufacturer (OEM) part (e.g., a tangible instrument exactly as the one that would be found in the actual system subject of the interactive simulation). The I/O 1162 may comprise necessary interface(s) to exchange data, set data or get data from such integrated tangible instruments.

The instrument module 1160 may comprise one or more physical module that may further be interconnected to provide a given configuration of the interactive computer program. As can be readily understood, instruments of the instrument module 1160 are expected to be manipulated by the user of the interactive computer simulation to input commands thereto.

The instrument module 1160 may yet also comprise a mechanical instrument actuator 1166 providing one or more mechanical assemblies for physical moving one or more of the tangible instruments of the instrument module 1160 (e.g., electric motors, mechanical dampeners, gears, levers, etc.). The mechanical instrument actuator 1166 may receive one or more sets of instruments (e.g., from the processor module 1130) for causing one or more of the instruments to move in accordance with a defined input function. The mechanical instrument actuator 1166 of the instrument module 1160 may alternatively, or additionally, be used for providing feedback to the user of the interactive computer simulation through tangible and/or simulated instrument(s) (e.g., touch screens, or replicated elements of an aircraft cockpit or of an operating room). Additional feedback devices may be provided with the computing device 1110 or in the computer system 1000 (e.g., vibration of an instrument, physical movement of a seat of the user and/or physical movement of the whole system, etc.).

The simulation computing device may also comprise one or more seats (not shown) or other ergonomically designed tools (not shown) to assist the user of the interactive computer simulation in getting into proper position to gain access to some or all of the instrument module 1160.

In the depicted example of FIG. 1, the computer system 1000 shows optional interactive computer simulation stations 1200, 1300, which may communicate through the network 1400 with the simulation computing device. The stations 1200, 1300 may be associated to the same instance of the interactive computer simulation with a shared computer generated environment where users of the computing devices 1100 and stations 1200, 1300 may interact with one another in a single simulation. The single simulation may also involve other simulation computing device(s) (not shown) co-located with the simulation computing device or remote therefrom. The simulation computing device and stations 1200, 1300 may also be associated to different instances of the interactive computer simulation, which may further involve other simulation computing device(s) (not shown) co-located with the simulation computing device or remote therefrom.

In the context of the depicted embodiments, runtime execution, real-time execution or real-time priority processing execution corresponds to operations executed during the interactive computer simulation that may have an impact on the perceived quality of the interactive computer simulation from a user perspective. An operation performed at runtime, in real-time or using real-time priority processing thus typically needs to meet certain performance constraints that may be expressed, for instance, in terms of maximum time, maximum number of frames, and/or maximum number of processing cycles. For instance, in an interactive simulation having a frame rate of 60 frames per second, it is expected that a modification performed within 5 to 10 frames will appear seamless to the user. Skilled persons will readily recognize that real-time processing may not actually be achievable in absolutely all circumstances in which rendering images is required. The real-time priority processing required for the purpose of the disclosed embodiments relates to perceived quality of service by the user of the interactive computer simulation, and does not require absolute real-time processing of all dynamic events, even if the user was to perceive a certain level of deterioration of quality of service that would still be considered plausible.

A simulation network (e.g., overlaid on the network 1400) may be used, at runtime (e.g., using real-time priority processing or processing priority that the user perceives as real-time), to exchange information (e.g., event-related simulation information). For instance, movements of a vehicle associated to the simulation-computing device and events related to interactions of a user of the simulation-computing device with the interactive computer generated environment may be shared through the simulation network. Likewise, simulation-wide events (e.g., related to persistent modifications to the interactive computer generated environment, lighting conditions, modified simulated weather, etc.) may be shared through the simulation network from a centralized computer system (not shown). In addition, the storage module 1500A-C (e.g., a networked database system) accessible to all components of the computer system 1000 involved in the interactive computer simulation may be used to store data necessary for rendering interactive computer generated environment. In some embodiments, the storage module 1500A-C is only updated from the centralized computer system and the simulation-computing device and stations 1200, 1300 only load data therefrom.

The interactive computer simulation system 1000 of FIG. 1 may be used to simulate the operation by a user of a user vehicle. For example, in a flight simulator, the interactive computer simulation system 1000 may be used to simulate the flying of an aircraft by a user acting as the pilot of the simulated aircraft. In a battlefield simulator, the simulator may simulate a user controlling one or more user vehicles such as airplanes, helicopters, warships, tanks, armored personnel carriers, etc. In both examples, the simulator may simulate an external vehicle (referred to herein as a simulated external vehicle) that is distinct from the user vehicle and not controlled by the user.

Figure 2:
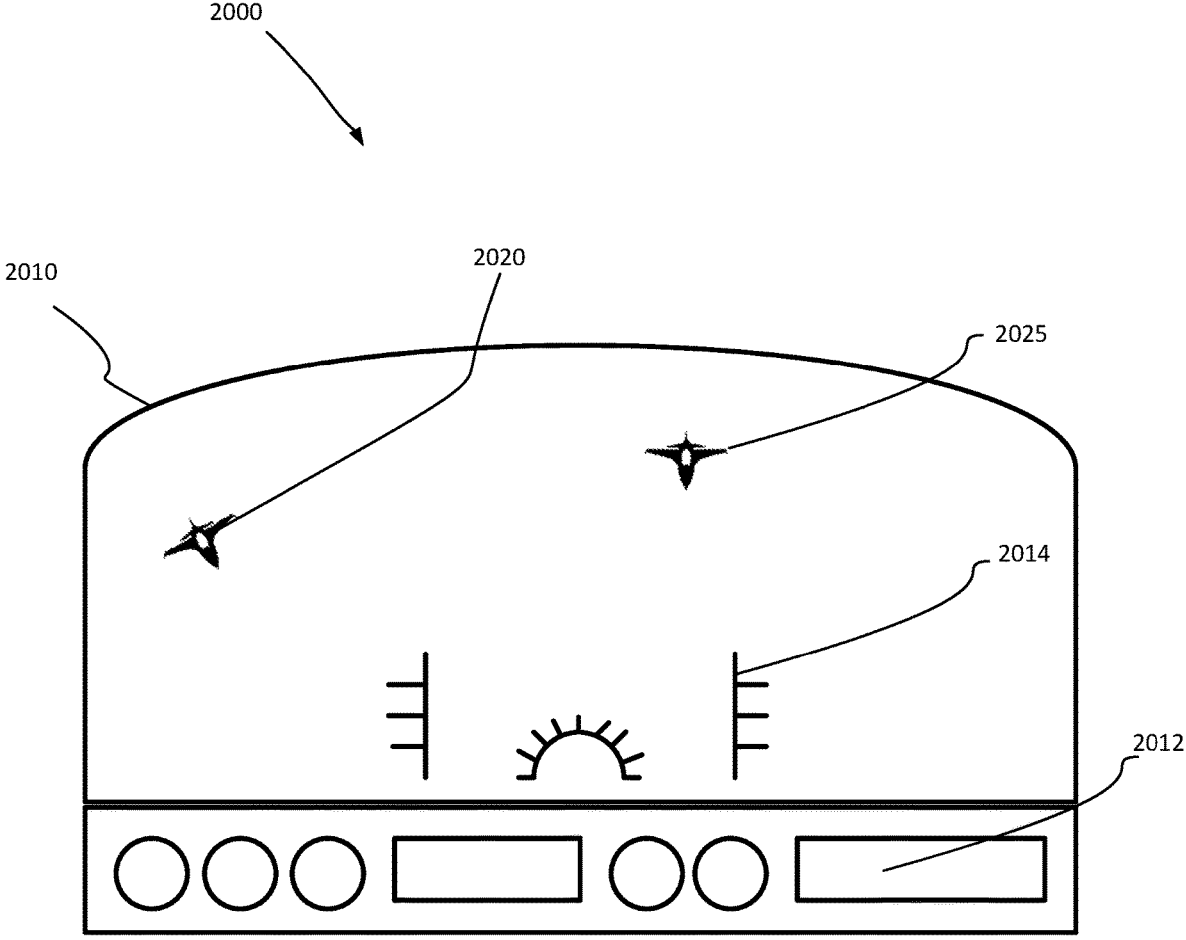
FIG. 2 depicts a flight simulator displaying two external aircraft as examples of simulated external vehicles.

FIG. 2 depicts a flight simulator 2000 in simplified form as an example of the interactive computer simulation system 1000. In this exemplary embodiment, the flight simulator 2000 has a display 2010 and tangible instrumentation 2012 for the user acting as the pilot of the simulated aircraft. In this example, the display 2010 presents a heads-up display (HUD) 2014 and external aircraft 2020, 2025. In this embodiment, the external aircraft 2020, 2025 are examples of simulated external vehicles. The simulated external vehicles 2020, 2025 may be allied aircraft or enemy aircraft. The simulated external vehicles may also be neutral or civilian aircraft. Each of the simulated external vehicles 2020, 2025 may be part of, or associated with, a computer-generated forces (CGF) entity. Each CGF entity has an intelligence module determining how each aircraft will behave. In other words, each CGF entity comprises the simulated external vehicle and an associated intelligence module that controls how that simulated external vehicle will behave. For example, the intelligence module may include rules, algorithms or artificial intelligence (also known as its doctrine) determining how the vehicle will behave, as an ally or enemy, in the simulation. This may include battlefield tactics, rules of engagement, or other rules defining how the CGF entity attacks enemy units, defends itself, etc. The simulator must also model the motion (dynamics or kinematics) of the simulated external vehicle in order to create a realistic CGF entity for the simulation.

A non-linear model of the simulated external vehicle mathematically describes its complex motion in the interactive computer simulation. This non-linear model can be linearized, or approximated by linear equations forming an array of state-space models. The linearized model is thus an approximation describing how the simulated external vehicle moves in the interactive simulated environment. To create this linearized model requires that the parameters be determined. Determining these parameters to create this linearized model for a CGF entity using conventional techniques is very laborious as was explained above because it requires extensive and time-consuming comparisons of state-space models with actual flight data. This is compounded when the simulation requires a large number of different types of aircraft. A novel method and system are disclosed herein that address this problem. In general, the state-space models (describing function model) for the simulated external object contains a plurality of interrelated parameters which affect, in a complex way, the simulated dynamics or kinematics of the simulated vehicle. In the case of a simulated aircraft, the resultant lift, drag, airspeed, pitch, roll and yaw of the simulated aircraft is a complex function of various parameters such as, for example, the settings/positions of the ailerons, elevator, rudder, angle of attack (AoA), altitude, airspeed, landing gear and/or weapons load (affecting aerodynamics), any changes in center of gravity, damage to the aircraft, turbofans conditions, etc.

As explained above, it is very challenging to determine values for all of the set of parameters that define the describing function or state-space models of the vehicle's dynamic motion. Disclosed herein are a method, system and computer-readable medium for efficiently determining a describing function (state-space models) in order to efficiently create a computer-generated forces entity for simulating the CGF entity within the simulation. As will be described in greater detail below, very short Gaussian pulses are used as input to obtain the frequency responses of each input-output relationship for a plurality of trim conditions. The expression "trim conditions" for the purpose of this specification shall mean, when the vehicle is an aircraft, the flight-affecting factors that affect the dynamics of the aircraft's flight, including positions of the flight control surfaces (ailerons, rudder, elevator, flaps, slats, flaperons, elevons, air-brakes), landing gear positions, and settings of the power plant (engine thrust, turbofan pressure, orientation of vector-thrust nozzles, rotor blade speed, rotor blade pitch, etc.) as well as other flight-affecting factors such as center of gravity, all-up-weight, angle-of-attack (current pitch angle), current roll angle or bank angle, speed at which the aircraft is trimmed (Mach number and/or airspeed in knots) and/or rate of climb, etc. The concept of "trim conditions" may also be applied to other vehicles such as a land-based vehicles (e.g. trucks, tanks, armored personnel carriers) or water-borne vehicles (e.g. surface ships, submarines). In the context of land-based vehicles or waterborne vehicles, the expression "trim conditions" shall mean any motion-affecting factors that affect the dynamics of the vehicle's motion, for example positions of vehicle control elements that affect the dynamics of the vehicle. For example, for a submarine, the trim conditions may be the rudder, dive planes (which may include separate tail planes and fore planes), ballast tanks, trim tanks, etc.

Depicted in FIG. 3 is a method 3000 of efficiently generating a computer-generated forces (CGF) entity that includes a simulated external vehicle used, or to be used, within an interactive computer simulation. For the purposes of this specification, "efficient generation" or "efficiently generating" mean that the CGF entity is generated quickly or rapidly as compared with the prior art. The simulated external vehicle is displayed, or displayable, within an interactive simulation environment by an interactive computer simulation station such as the one depicted in FIG. 2. The method 3000 entails a sequence of steps, acts or operations which are not necessarily performed in the order shown. The method 3000 entails creating 3010 an array of state-space model structures having initially unknown parameters that, once known, will define a linearized approximation of a non-linear model of the simulated external vehicle. In one embodiment, there may be only a single state-space model structure. The method 3000 further entails generating 3020 frequency response matrices by exciting each input-output relationship of the non-linear model of the simulated external vehicle at a plurality of trim conditions using very short Gaussian pulses. The frequency response matrices define a plurality of linear equations. The method 3000 further includes calculating 3030 the parameters by solving the linear equations of the frequency response matrices to thereby provide an array of state-space models that defines the linearized approximation of the non-linear model of the simulated external vehicle. The method further involves using 3040 the array of state-space models to generate the CGF entity. The array of state-space models is also known as a describing function or describing model function. Optionally, the method 3000 includes simulating 3050 the simulated external vehicle as a CGF entity within a simulation.

In one implementation of method 3000, some of the parameters of the array of state-space models may be known, e.g. from flight test data or from original equipment manufacturer (OEM) specifications, for some predetermined trim conditions of the simulated external vehicle. Accordingly, the number of unknown parameters to be calculated using the above technique may vary depending on whether some of the parameters are already known.

In one implementation of the method 3000, the act of calculating the parameters by solving the linear equations of the frequency response matrices comprises calculating the frequency response matrices over a wider range of frequencies than a band of frequencies of the Gaussian pulses.

In one embodiment of the method 3000, each of the Gaussian pulses has a period no longer than 2 seconds. In another embodiment of the method 3000, each of the Gaussian pulses has a period no longer than 1 second.

The method 3000 may optionally be performed using pole placement controllers that exploit characteristics of the Fourier transform integral to eliminate spectral leakage without sacrificing frequency resolution by windowing. In other words, windowing is not required in this implementation.

In the method 3000, the simulated external vehicle may be a simulated aircraft, such as a fixed-wing aircraft or a rotary-wing aircraft. Due to the complexity of flight, for a high-fidelity (Level-D) simulation, the simulated aircraft is modeled using non-linear equations which are linearized into an array of state-space models. The parameters of these state-space models are calculated by exciting each input-output relationship for various trim conditions to generate frequency response matrices from which linear equations are extracted and solved. For a fixed-wing aircraft, the trim conditions may include flight parameters such as rudder position, elevator position, aileron position, angle-of-attack, center of gravity, altitude, airspeed, bank angle, and rate of climb. Other trim conditions may include aerodynamic factors like landing gear, external weapon load, drop tanks, air-brake, etc. Other trim conditions include engine thrust, or more specific engine performance parameters like turbofan pressure. Damage to aircraft affecting aerodynamics or engine performance may also be a parameter that is part of the trim conditions. Other trim conditions may include the yaw angle or roll angle, all-up-weight, weather conditions, Mach number, airspeed, etc.

FIG. 4 depicts a method 4000 of generating a CGF entity that includes a simulated fixed-wing aircraft (whose motion is described in terms of its trim conditions using a non-linear model). The method 4000 seeks to generate a (linearized) describing model function ML (an array of state-space models) representing the dynamics or kinematics of the aircraft by defining the motion of the aircraft as a linearized approximation of the non-linear model MNL. A kinematics model defines the motion of the aircraft whereas a dynamics model defines the forces and moments on the aircraft. Whether the model is kinematic or dynamic, the linearized or parametric model (describing model ML) defines a linearized approximation of how the aircraft moves depending on its trim conditions. For a fixed-wing aircraft, the describing model ML may define the aircraft's resulting motion in terms of airspeed, acceleration, roll rate, pitch rate, yaw rate, lift, drag, rate of climb, etc. In this example, the model ML describing the kinematics or dynamics of the aircraft are a complex function of its trim conditions. For example, for a fixed-wing aircraft, the trim conditions include flight-affecting factors such as the positions of the ailerons, rudder, elevator, flaps, slats, air-brake, canards, angle-of-attack, all-up-weight, altitude/pressure, airspeed, weapon load, drop tanks, landing gear, etc.

At step 4010 of FIG. 4, the method creates an array of state-space model structures $M_L1$, $M_L2$, $M_L3$, $M_L4$, etc. having initially unknown parameters that, once known, will define a linearized approximation of a non-linear model of the aircraft. The initially unknown parameters are denoted P1, P2, P3, P4, etc. These linearized equations are expressed in terms of a plurality of trim conditions (TC1, TC2, TC3, TC4, etc.) and respective parameters (P1, P2, P3, P4, etc.). Without laborious flight testing, these parameters are initially unknown or at the very least a subset of the parameters is initially unknown. For example, each of the state-space models M1, M2, M3, M4, etc. in the array may describe one type of motion (e.g. pitch, roll, yaw, rate of climb/descent, etc.) and is expressed in terms of the various trim conditions and the initially unknown parameters.

To determine the parameters of the state-space models, the non-linear model MNL of the aircraft is excited using very short Gaussian pulses (denoted f1, f2, f3, f4, etc.). In this method, each input-output relationship for each trim condition TC1, TC2, TC3, TC4, etc. is excited using the very short Gaussian pules f1, f2, f3, f4, etc. In other words, for each trim condition, the model is excited using very short Gaussian pulses which may be at various discrete frequencies (f1, f2, f3, f4, etc.). The input-output relationship is thus the frequency response to the frequency input for a particular trim condition to observe how that particular trim condition affects the non-linear model.

The frequency responses of the non-linear model MNL to these Gaussian pulses are assembled into frequency response matrices at step 4020. The frequency response matrices are systems of linear equations that may be solved at step 4030 to determine the parameters P1, P2, P3, P4, etc. Once the parameters are determined by solving the linear equations of the frequency response matrices, the parameters are assigned to the array of state-space model structures to provide the array of state-space models at step 4040. This array of state-space models with the known parameters defines the linearized approximation of the non-linear model of the simulated aircraft. The array of state-space models is the describing function M (also known as the describing model function M). This describing function M can be used to generate the CGF entity. The CGF entity may be integrated into a simulation. This technique makes it less computationally intensive to simulate external aircraft or, by analogy, other external vehicles that are CGF entities in the simulation.

For example, a first nonlinear model $M_{NL}1$ may describe the pitch of the aircraft. The trim conditions TC1, TC2, TC3, and TC4 may be, for example, the elevator angle, landing gear, weapons load, and flaps, respectively. By exciting the model $M_{NL}1$ using very short Gaussian pulses f1, f2, f3 f4, etc.), the frequency responses FR(f1,TC1), FR(f2,TC1), FR(f3,TC1) and FR(f4,TC1) are determined, representing how the elevator trim affects the pitch. The frequency responses FR(fn,TC2), where n=1, 2, 3, 4, are also determined, representing how the landing gear affects the pitch. The frequency responses FR(fn,TC3) and FR(fn,TC4) are also determined, representing how the weapons load and flaps each respectively affect the pitch. Accordingly, in this method, each input-output relationship is excited for each of the trim conditions of the model in order to produce the frequency response matrices as shown in FIG. 4. As noted above, the linear equations are solved to determine the parameters. These parameters are inserted into the state-space model structures to produce the state-space models $M_L$ representing a linearized approximation of the original non-linear model MNL for the motion of the aircraft. This technique enables CGF entities to be generated in a computationally efficient (rapid) manner.

The deterministic character of the aircraft simulation model is exploited. Pole placement based controllers or optimal modal controllers may be utilized to exploit characteristics of the Fourier transform integral and effectively eliminate all spectral leakage without sacrificing frequency resolution by windowing. No windowing is required in this implementation. The method uses efficient excitation of the aircraft simulation model to calculate the frequency response over a predetermined frequency band. In one embodiment, instead of using long frequency sweeps for system identification from flight test data, very short Gaussian pulses are used to perform a frequency sweep to sufficiently excite each input-output relationship, i.e. to excite the non-linear model. The very short Gaussian pulses may be combined with pole placement controllers to sufficiently excite each input-output relationship. In one specific embodiment, each of these very short Gaussian pulses has a period that is no longer than 2 seconds. In another embodiment, each of the Gaussian pulses has a period that is no longer than 1 second. Using very short Gaussian pulses significantly reduces the runtime of the simulation aircraft model required to accurately calculate its frequency response matrix. Frequency response matrix calculation is then performed by solving a system of linear equations over a wide range of frequencies, i.e. over a range of frequencies that is wider than the frequency band of the Gaussian pulses. In some embodiments, the controller(s) actively cause a return to the unperturbed (unexcited) trim condition before the subsequent Gaussian pulse is used to excite the model. In other cases, due to the nature of the aircraft's dynamics, the output is naturally dampened so that the output returns to its unperturbed trim condition.

From the foregoing, it will be understood that the very short Gaussian pulses that are used to perform the frequency sweep to excite the non-linear model are provided by one or more of the tangible instruments of the computer simulation station. The tangible instruments are the physical and tangible user controls that are physically manipulated by the user of the computer simulation to operate the simulated vehicle in the computer simulation. To generate an input signal, a tangible instrument of the computer simulation station is physically moved (actuated). An output signal is generated in response to the input signal. The output signal defines the response of the non-linear model to the input signal at a particular set of trim conditions. Performing the frequency sweep thus entails generating a plurality of output signals (non-linear model responses) in response to various input signals at various trim conditions. The various input signals are generated by successively actuating or moving the various tangible instruments of the computer simulation station at different trim conditions to thereby obtain the non-linear model responses to these various inputs. By observing, in the frequency domain, the frequency response (output) to an input, the frequency response matrix described above can be generated for the non-linear model. Accordingly, the CGF entity is generated by obtaining the frequency response of a non-linear model to the inputs made to the one or more tangible instruments of the computer simulation station.

The description of the present invention has been presented for purposes of illustration but is not intended to be exhaustive or limited to the disclosed embodiments. Many modifications and variations will be apparent to those of ordinary skill in the art. The embodiments were chosen to explain the principles of the invention and its practical applications and to enable others of ordinary skill in the art to understand the invention in order to implement various embodiments with various modifications as might be suited to other contemplated uses.

Some of the foregoing methods can be implemented in hardware, software, firmware or as any suitable combination thereof. That is, if implemented as software, the computer-readable medium comprises instructions in code which when loaded into memory and executed on a processor of a computing device (or computer system) causes the computing device (or computer system) to perform any of the foregoing method steps.

These method steps may be implemented as software, i.e. as coded instructions stored on a computer readable medium which performs the foregoing steps when the computer readable medium is loaded into memory and executed by the microprocessor of the computing device. A computer readable medium can be any means that contain, store, communicate, propagate or transport the program for use by or in connection with the instruction execution system, apparatus or device. The computer-readable medium may be electronic, magnetic, optical, electromagnetic, infrared or any semiconductor system or device. For example, computer executable code to perform the methods disclosed herein may be tangibly recorded on a computer-readable medium including, but not limited to, a floppy-disk, a CD-ROM, a DVD, RAM, ROM, EPROM, Flash Memory or any suitable memory card, etc. The method may also be implemented in hardware. A hardware implementation might employ discrete logic circuits having logic gates for implementing logic functions on data signals, an application-specific integrated circuit (ASIC) having appropriate combinational logic gates, a programmable gate array (PGA), a field programmable gate array (FPGA), etc.

For the purposes of interpreting this specification, when referring to elements of various embodiments of the present invention, the articles "a", "an", "the" and "said" are intended to mean that there are one or more of the elements. The terms "comprising", "including", "entailing", "involving" and "having" are intended to be inclusive and open-ended by which it is meant that there may be additional elements other than the explicitly listed elements.

This invention has been described in terms of specific implementations and configurations which are intended to be exemplary only. Persons of ordinary skill in the art will appreciate that many obvious variations, refinements and modifications may be made without departing from the inventive concept(s) presented in this application. The scope of the exclusive right is therefore intended to be limited solely by the appended claims.

What is claimed is:

1. A method of generating a computer-generated forces (CGF) entity that includes a simulated external vehicle to be used within an interactive computer simulation that is displayed within an interactive simulation environment by an interactive computer simulation station, the simulated external vehicle being distinct from a simulated user-controlled vehicle controlled by a user of the interactive computer simulation, the method comprising:

creating an array of state-space model structures having initially unknown parameters that, once known, will define a linearized approximation of a non-linear model of the simulated external vehicle;

generating frequency response matrices by exciting each input-output relationship of the non-linear model of the simulated external vehicle at a plurality of trim conditions using Gaussian pulses each having a period no longer than 2 seconds, wherein the Gaussian pulses are provided by physically manipulating one or more tangible instruments of the interactive computer simulation station via a mechanical instrument actuator, wherein the frequency response matrices define a plurality of linear equations;

calculating the parameters by solving the linear equations of the frequency response matrices to thereby provide an array of state-space models that defines the linearized approximation of the non-linear model of the simulated external vehicle; and using the array of state-space models to generate the CGF entity.

2. The method of claim 1 further comprising simulating the simulated external vehicle as part of the interactive computer simulation.

3. The method of claim 1 wherein each of the Gaussian pulses has a period no longer than 1 second.

4. The method of claim 1 wherein calculating the parameters by solving the linear equations of the frequency response matrices comprises calculating the frequency response matrices over a wider range of frequencies than a band of frequencies of the Gaussian pulses.

5. The method of claim 1, wherein the simulated external vehicle is a simulated aircraft, wherein the trim conditions comprise one or more of a rudder position, an elevator position, an aileron position, angle-of-attack, center of gravity and altitude.

6. The method of claim 1, further comprising using pole placement controllers to eliminate spectral leakage without impairing frequency resolution and wherein the controllers cause an output to return to an unperturbed trim condition.

7. A computer system to generate a computer-generated forces (CGF) entity that includes a simulated external vehicle to be used within an interactive computer simulation that is displayed within an interactive simulation environment by an interactive computer simulation station, the simulated external vehicle being distinct from a simulated user-controlled vehicle controlled by a user of the interactive computer simulation, the computer system comprising a processor and a memory coupled to the processor, the processor being configured to:

create an array of state-space model structures having initially unknown parameters that, once known, will define a linearized approximation of a non-linear model of the simulated external vehicle;

generate frequency response matrices by exciting each input-output relationship of the non-linear model of the simulated external vehicle at a plurality of trim conditions using Gaussian pulses each having a period no longer than 2 seconds, wherein the Gaussian pulses are provided by physically manipulating one or more tangible instruments of the interactive computer simulation station via a mechanical instrument actuator, wherein the frequency response matrices define a plurality of linear equations;

calculate the parameters by solving the linear equations of the frequency response matrices to thereby provide an array of state-space models that defines the linearized approximation of the non-linear model of the simulated external vehicle; and use the array of state-space models to generate the CGF entity.

8. The computer system of claim 7 wherein the processor is configured to simulate the simulated external vehicle as part of the interactive computer simulation.

9. The computer system of claim 7 wherein each of the Gaussian pulses has a period no longer than 1 second.

10. The computer system of claim 7 wherein the processor is configured to calculate the parameters by calculating the frequency response matrices over a wider range of frequencies than a band of frequencies of the Gaussian pulses.

11. The computer system of claim 7, wherein the simulated external vehicle is a simulated aircraft, wherein the trim conditions comprise one or more of a rudder position, an elevator position, an aileron position, angle-of-attack, center of gravity and altitude.

12. The computer system of claim 7, wherein the processor is configured to use pole placement controllers to eliminate spectral leakage without impairing frequency resolution and wherein the controllers cause an output to return to an unperturbed trim condition.

13. A non-transitory computer-readable medium having computer-readable code which is executable by a processor to perform a method of generating a computer-generated forces (CGF) entity that includes a simulated external vehicle to be used within an interactive computer simulation that is displayed within an interactive simulation environment by an interactive computer simulation station, the simulated external vehicle being distinct from a simulated user-controlled vehicle controlled by a user of the interactive computer simulation, the method comprising:

creating an array of state-space model structures having initially unknown parameters that, once known, will define a linearized approximation of a non-linear model of the simulated external vehicle;

generating frequency response matrices by exciting each input-output relationship of the non-linear model of the simulated external vehicle at a plurality of trim conditions using Gaussian pulses each having a period no longer than 2 seconds, wherein the Gaussian pulses are provided by physically manipulating one or more tangible instruments of the interactive computer simulation station via a mechanical instrument actuator, wherein the frequency response matrices define a plurality of linear equations;

calculating the parameters by solving the linear equations of the frequency response matrices to thereby provide an array of state-space models that defines the linearized approximation of the non-linear model of the simulated external vehicle; and using the array of state-space models to generate the CGF entity.

14. The non-transitory computer-readable medium of claim 13 wherein the processor is configured to simulate the simulated external vehicle as part of the interactive computer simulation.

15. The non-transitory computer-readable medium of claim 13 wherein each of the Gaussian pulses has a period no longer than 1 second.

16. The non-transitory computer-readable medium of claim 13 wherein the processor is configured to calculate the parameters by calculating the frequency response matrices over a wider range of frequencies than a band of frequencies of the Gaussian pulses.

17. The non-transitory computer-readable medium of claim 13, wherein the simulated external vehicle is a simulated aircraft, wherein the trim conditions comprise one or more of a rudder position, an elevator position, an aileron position, angle-of-attack, center of gravity and altitude.

18. The non-transitory computer-readable medium of claim 13, wherein the processor is configured to use pole placement controllers to eliminate spectral leakage without impairing frequency resolution and wherein the controllers cause an output to return to an unperturbed trim condition.

* * * * *